United States Patent
Kreusser (10) Patent No.: US 10,546,158 B2
(45) Date of Patent: Jan. 28, 2020

(54) FUNCTION GENERATOR FOR THE DELIVERY OF ELECTRICAL SIGNALS

(71) Applicant: Rohde & Schwarz GmbH & Co. KG, Munich (DE)

(72) Inventor: Stefan Kreusser, Olching (DE)

(73) Assignee: ROHDE & SCHWARZ GMBH & CO.KG, Munich (DE)

( * ) Notice: Subject to any disclaimer, the term of this patent is extended or adjusted under 35 U.S.C. 154(b) by 0 days.

(21) Appl. No.: 14/827,700

(22) Filed: Aug. 17, 2015

(65) Prior Publication Data

US 2016/0162261 A1    Jun. 9, 2016

(30) Foreign Application Priority Data

Dec. 4, 2014    (DE) .......................... 10 2014 224 839
Feb. 12, 2015    (DE) .......................... 10 2015 202 505

(51) Int. Cl.
*G06G 7/26*    (2006.01)

(52) U.S. Cl.
CPC ..................................... *G06G 7/26* (2013.01)

(58) Field of Classification Search
CPC . G06F 1/02; G06F 1/022; G06F 1/102; G01R 25/00; G01R 25/04; G01R 31/28; G01R 31/2806; G01R 31/31908; G01R 31/3191; G01R 31/3167; G01R 31/317; G01R 31/316; G01R 31/319; G01R 31/31914; G01R 31/31915; G01R 31/3161; G01R 31/3163; G01R 35/00; G01R 35/02; G01R 19/00; G01R 19/0084;
(Continued)

(56) References Cited

U.S. PATENT DOCUMENTS 4,648,060 A  *  3/1987 Allen ..................... H03B 21/02
                                                    331/2
5,412,414 A      5/1995 Ast et al.
(Continued)

FOREIGN PATENT DOCUMENTS

DE            39 11 373 A1    11/1997
DE    10 2005 024 624 B3    11/2006

OTHER PUBLICATIONS

Thomas Alpert, Arbitrary Waveform Generator Based on FPGA and High-Speed DAC with Real-Time Interface, 2012, PRIME 2012, Aachen, Germany, Session TG2-Transceivers I, p. 1 Fig 1(a).*
(Continued)

*Primary Examiner* — Andrew Caldwell
*Assistant Examiner* — Emily E Larocque
(74) *Attorney, Agent, or Firm* — Ditthavong & Steiner, P.C.

(57) ABSTRACT

A function generator provides a first signal unit for the delivery of a first signal at a first output. The function generator provides a second signal unit for the delivery of a second signal at a second output. The function generator provides a calibration unit for the generation of a test signal, wherein the test signal can be supplied to the first signal unit and/or to the second signal unit. A comparison unit is connected downstream of the first signal unit and/or the second signal unit. The comparison unit compares the test signal delivered at the first output and/or at the second output with a calibration signal, wherein the output signal of the comparison unit can be supplied to the calibration unit.

11 Claims, 8 Drawing Sheets

(58) Field of Classification Search
CPC ... G01R 19/165; G01R 19/16555; H03L 7/00; H03L 7/083; H03L 7/0814–0818; H03L 7/097; H03L 7/24; G06G 7/26
USPC ......... 708/270, 845, 811, 124–126; 327/164, 327/231, 233, 237, 243, 245, 250, 252, 327/253, 258, 261
See application file for complete search history.

(56) References Cited

U.S. PATENT DOCUMENTS

| | | | |
|---|---|---|---|
| 7,237,167 B2 | 6/2007 | Inaba et al. | |
| 7,436,725 B2* | 10/2008 | Miki | G11C 7/1006 341/101 |
| 2009/0167375 A1* | 7/2009 | Miki | G01R 31/31922 327/117 |

OTHER PUBLICATIONS

C. Barrett, Fractional/Integer-N PLL Basics, Texas Instruments, Wireless Communication Business Unit, Technical Brief SWRA029, 1999 p. 31-38. (Year: 1999).*

R. Maher, All About Phase, Dept. of Electrical and Computer Engineering, Montana State University, IEEE 2009, p. 218-222 (Year: 2009).*

* cited by examiner

FUNCTION GENERATOR FOR THE DELIVERY OF ELECTRICAL SIGNALS

PRIORITY

This application claims priority of German patent applications DE 10 2014 224 839.6 filed on Dec. 4, 2014 and DE 10 2015 202 505.5 filed on Feb. 12, 2015 which are incorporated herewith by reference.

FIELD OF THE INVENTION

The invention relates to a function generator for the delivery of electrical signals, a system and a method.

BACKGROUND OF THE INVENTION

Function generators are used to deliver signals with different frequency, amplitude, modulation, value ranges, time characteristics and/or interruptions. In this context, a plurality of different signals is sometimes generated by different signal units of a function generator, wherein a plurality of signals can be delivered at different outputs of a function generator.

A test appliance which provides a function generator with different signal units for testing a device under test is known from U.S. Pat. No. 7,237,167 B2. This test appliance comprises both analog modules for the generation of analog test signals and also digital modules for the generation of digital test signals. A test program running in the test appliance controls the analog and digital modules. A synchronisation unit is provided to control the procedure of the test program.

It is sometimes necessary to connect several generated electrical signals to a device under test at the same time, wherein, in practice, only one function generator is to be used for this purpose, to deliver these signals. Measurement equipment for the investigation of devices under test is therefore embodied in a less complex manner and the signal paths from generation through to delivery are optionally shortened. In the case of a simultaneous connection of different measurement signals to a device under test, it should be noted that the time coherence, especially a relative phase angle between the measurement signals, is known. In particular, an occurrence of an error in which faulty conditions are generated in the device under test because of an unknown coherence or an incoherence between a first signal and a second signal of the function generator, which would not have occurred with the required coherence of these signals, must be precluded.

The object of the present invention is therefore to specify a function generator and a method for the delivery of electrical signals, in which the delivered signals comprise a known and rigidly defined phase angle, especially a known relative phase-angle value relative to one another. In particular, it should thus be possible to connect different electrical signals, for example, analog signals and/or digital signals with different modulations and different frequencies, to a device under test at the same time.

SUMMARY OF THE INVENTION

According to a first aspect of the invention a function generator for the delivery of electrical signals is provided. The function generator comprises a first signal unit for the delivery of a first signal at a first output. The function generator provides a second signal unit for the delivery of a second signal at a second output. Further signal units for the delivery of further signals can be contained in the function generator.

According to this aspect of the invention, the function generator provides a calibration unit for the generation of a test signal, wherein the test signal can be supplied to the first signal unit and/or to the second signal unit. A comparison unit is connected downstream in the signal path to the first signal unit and/or to the second signal unit, wherein the comparison unit compares the test signal delivered at the first output or at the second output with a calibration signal, and wherein the output signal of the comparison unit can in turn be supplied to the calibration unit.

Accordingly, the function generator is preferably provided in order to deliver several electrical signals at respective outputs. In this context, the signals can provide different properties. Because of the different properties, for example, the frequency of the signal, the modulation of the signal, the amplitude level of the signal, the number of signal levels of the signal, the polarity of the signal and/or its pulse, these signals are delivered by different signal units, so that different time delays are caused as a result of the different signal units. This time delay in the delivery is attributable in particular to the different signal paths within the individual signal units in the function generator. As a result of these different signal paths, the signals of the function generator are delivered with an unknown time coherence or respectively they are time incoherent relative to one another.

Through the use of the calibration unit according to another aspect of the invention and the generation of a test signal by the calibration unit, the individual signal paths of the signals can be compared with a calibration signal. The calibration signal is provided in order to obtain a comparison value in the case of a comparison of the test signal by means of a comparison unit. This comparison value is preferably used in the calibration unit of the function generator to register the time coherence between the individual signal paths of the respective signal units and to adjust this time coherence to a defined value. In particular, a phase-angle value of the first signal relative to a second signal is adjustable through the output signal of the comparison unit.

The calibration unit and also the comparison unit are preferably components of the function generator and should each be provided as an internal module within the function generator. The reception of an output signal in a comparison unit establishes the extent to which the test signal is time displaced from the calibration signal. Accordingly, the output signal of the comparison unit is a measure for the relative time displacement of a first signal path and a calibration signal path. Now, if, instead of a first signal and/or of a second signal, a test signal is initially generated according to a specification in the function generator and delivered via the same signal path as the first signal and/or the second signal, it is possible to determine which runtime delay occurs as a result of the signal path. This runtime delay is taken into consideration in the correct use of the function generator. Dependent upon the specific use of the function generator, the determined runtime delay of the first signal unit and/or of the second signal unit is prevented during the delivery of the first signal and/or of the second signal or a consciously selected value is adjusted. Through the use of this calibration method on every signal unit of the function generator, the relative time coherence between the individual signal units can be registered and either consciously avoided or adjusted in a defined manner.

Accordingly, by means of the output signal of the comparison unit, a calibration of the first signal and/or of the second signal can take place, and a defined time coherence can be created between the first signal and the second signal.

The test signal of the calibration unit is preferably an internal test signal and is set up to run through at least the first and/or the second signal unit.

The test signal is then preferably connected to a first input of the comparison unit. This first input is preferably disposed in the immediate proximity to the actual first output or actual second output of the function generator, ideally, the pickup takes place internally, directly at one of the port contacts. This means that the signal path of the test signal corresponds directly to the signal path of the first signal or of the second signal path, and signal runtimes of the test signal and first signal or respectively second signal are, as far as possible, identical.

By preference, the time delay of the calibration path is known or can be correspondingly determined within the function generator, so that additional time delays resulting from the comparison unit, the calibration unit and the generation of the test signal can be taken into consideration for the registration of the time coherence of the first signal unit relative to the second signal unit.

By preference, this first signal unit is an analog unit, and the first signal is an analog signal. The generation of an analog signal is implemented in the function generator on the basis of digital signals. The digital signals are converted into analog signals in the analog unit by means of an analog-digital converter. Optionally, further signal processing steps can be provided within the analog unit, for example, an analog signal filtering and/or an analog modulation. Within the framework of signal theory, an analog signal is a form of electrical signal with a step-free and interruption-free characteristic at least in given time segments.

In non-ideal systems, the conversion of the digital signal into an analog signal preferably takes place with a time delay. Furthermore, the signal conditioning through further analog circuit elements prior to the delivery of the analog signal at the first output of the function generator can determine a settling of the analog signal. This settling also leads to a time delay. For example, if an analog signal and a digital signal are delivered at the output, the signal path for the analog signal provides a longer signal runtime than the signal path of the second signal. This additional time delay is registered according to the invention and can accordingly be corrected or consciously used.

In one preferred embodiment, the second signal unit is a digital unit, wherein the second signal is a digital signal. A digital signal is a special form of electrical signal which, on the one hand, provides a demarcated and stepped value-domain and is also defined in the time sequence or respectively provides a variation in the signal value only at a given periodic timing points.

The second signal unit is provided by a programmable integrated circuit, for example, a Field Programmable Gate Array abbreviation FPGA, or a Complex Programmable Logic Device, abbreviation CPLD, or an Application Specific Integrated Circuit, abbreviation ASIC.

For this purpose, for example, arbitrary waveform files, short: ARB files are supplied to the function generator. The ARB files contain control information for the respective digital outputs. The digital signals are for instance 16 digital output signals that are used to simulate at least one or more slow serial or parallel data busses to simulate a DUT-feeding. Those digital signals are used to bring the DUT at a time moment x into a specific condition, e.g. switch a DUT RF-switch, and to measure the DUT's response time with an oscilloscope, e.g. the duration for a stable signal amplitude. The frequency of such signals do normally not exceed 20 Megahertz. Such a time delay can be determined by the comparison unit and calibration unit according to the invention in such a manner that a time reference between the signals is known and can optionally be calculated out.

In particular through the use of a first signal unit as an analog unit for the generation of an analog signal and a second signal unit as a digital unit for the generation of a digital signal, time delays occur between the analog signal and the digital signal. By means of the calibration unit and the generated test signal, a comparison can now be made with a calibration signal, so that the output signal of the comparison unit can be supplied to the calibration unit. In the calibration unit, the time delay between the first signal and the second signal can then be corrected.

In a preferred embodiment, the first signal unit or the second signal unit provides the calibration unit. For example, the calibration unit can be formed by the same programmable integrated circuit, which is also available as the second signal unit for the provision of a digital unit. Accordingly, a further time delay or additional error sources within the function generator are avoided. In particular, the output signal of the comparison unit can be used directly for the time displacement of the first signal and/or of the second signal, wherein no other intermediate unit is necessary for the calibration of the time delay.

In particular, the programmable integrated circuit is preferably used as the signal source for the delivery of an analog signal, wherein this integrated circuit generates a digital signal which is then converted in an analog-digital conversion to form an analog signal.

In one preferred embodiment, the calibration unit comprises a phase shifter unit, so that a phase angle of the first signal and/or of the second signal is adjustable. For example, a defined phase-angle value is delivered to the phase shifter unit by the calibration unit, so that a time delay of the first signal relative to the second signal is varied.

The determination of this defined phase-angle value preferably takes place by means of the test signal and the comparison of the test signal with a calibration signal. If the output signal of the comparison unit results in an agreement of the phase angle of the test signal and the calibration signal, that is, a phase-angle value of zero degrees, the time delay resulting from the signal path of the test signal has been correctly registered and matched.

Alternatively or additionally, a defined phase-angle value can be set, for example, 90° or 180° by the digital unit. Further phase-angle value adjustments are not precluded according to the invention. An adjustment of the phase angle with a period greater than $2 \cdot \pi$ can therefore also be obtained.

Alternatively, a rigidly defined time delay between the first signal and the second signal can also be adjusted, for example, a fixed time delay $T_x$, so that a first signal provides an adjustable and defined time interval relative to a second signal.

These defined phase-angle values are preferably either specifications for the operation of the function generator and are delivered to the function generator via a control input or are stored in the function generator as specifications. For example, a correction of the first signal path and of a second signal path is implemented in succession. In this context, a signal delay time of the first signal unit is calibrated. Following this, the calibration of the signal delay time of the second signal takes place. The function generator accordingly delivers signals with time coherence which provide a defined phase-angle value. By preference, the phase-angle value is substantially zero degrees.

In a preferred embodiment, the calibration unit registers a maximal DC component of the output signal of the comparison unit. In the case of the registration of the maximal DC component of the output signal, the phase angle of the first signal and/or of the second signal accordingly agrees with the phase angle of the calibration signal. First, a phase value of 0° is adjusted and subsequently, further phase values different from 0° can be set by the digital unit. This achieves the time coherence between a first signal and a second signal with a now known phase-angle value. The phase-angle value can now also be varied in a defined manner.

By preference, the comparison unit provides a comparator circuit or an AND gate.

The comparison unit preferably further provides a low-pass filter unit and an analog-digital converter. In this manner, the test signal is compared with the calibration signal, wherein the comparison signal of a comparator or of an AND gate is connected directly to the low-pass filter unit.

The low-pass filter unit preferably filters out the frequency components of the comparison signal, so that only the DC voltage component is obtained at the output of the low-pass filter unit. This DC voltage component is converted via an an analog-digital converter into a digital DC voltage. The digital DC voltage is supplied to the calibration unit. The calibration unit causes the variation of the phase angle of the test signal until the desired digital DC voltage is registered. For a phase-angle value of 0° between a first signal and a second signal, the DC voltage component must be maximal.

This variation of the phase angle takes place, for example, through a stepwise raising of a pre-set phase-angle value of the test signal. Since the calibration signal is independent of the settings of the function generator, a time displacement of the test signal relative to the calibration signal takes place through this stepwise raising of the phase-angle value. In this manner, the DC component of the output signal of the comparison unit is also varied. Accordingly, a defined phase angle between test signal and calibration signal can be adjusted, wherein, with the use of a square-wave test signal and a square-wave calibration signal, the maximal DC voltage component of the output signal of the comparison unit corresponds to a phase angle of zero degrees, and a minimal DC voltage component of the output signal of the comparison unit corresponds to a phase angle of 180°.

By preference, the calibration unit provides a buffer. In particular, the current phase-angle values of the test signal are stored in this buffer. The buffer is then read out in order to adjust the current phase angle. For example, the current phase value can be incremented or decremented by the calibration unit, in order to achieve a displacement of the test signal relative to the calibration signal. In this context a start value of the phase angle of the test signal can be stored in advance in the buffer.

In one preferred embodiment, the calibration signal is supplied to the function generator as an external signal. This is particularly meaningful if the function generator is integrated in a measurement instrument, for example, a digital storage oscilloscope or spectrum analyser. The calibration signal is then used to match different units within the measuring instrument with one another with regard to time.

Alternatively, it is also conceivable for the function generator to provide an internal calibration source and for the calibration signal to be generated internally. In this embodiment, the function generator can be operated in a completely independent manner, and the calibration is implemented without further units.

Furthermore, according to still another aspect of the invention, a system comprising a measuring instrument and a device under test is provided, wherein the measuring instrument comprises a function generator of the type already described, and wherein the first signal and the second signal of the function generator are supplied to the device under test at the same time. In this context, it should be noted that the first signal and the second signal are time-coherent with one another. The time coherence is achieved, by adjusting a defined phase angle, wherein the function generator should be calibrated in the manner previously described for this purpose.

Accordingly, preferably a plurality of different signals with different properties can be delivered to the device under test, which are, however, present in the device under test at the same time, so that the device under test does not cause measurement errors as a result of the time incoherence of the signals.

In a preferred embodiment, the first signal and the second signal of the function generator are supplied to the device under test only when the phase angle between the first signal and the second signal corresponds to a defined phase-angle value, for example, zero degrees, or a multiple of the period or of a defined time duration. This ensures that the function generator delivers output signals only when a calibration of the signal units has been completed, and the time coherence between the first signal and the second signal has been established.

By preference, the first signal is an analog signal, and the second signal is a digital signal. Through different signal paths and the corresponding different signal delay times, the system ensures that time coherent signals are present in the device under test.

Time coherence is preferably understood to mean a rigidly adjusted phase-angle value which has been determined and which is known on the basis of the calibration of the individual signal units. The phase-angle value can provide an arbitrary known value, for example, zero degrees between a first signal and a second signal.

By preference, the calibration of the function generator is implemented with every activation of the function generator, so that it is ensured before the delivery of the signals that the signals are delivered with a known time coherence.

A method for the delivery of electrical signals through a function generator is further proposed according to still another aspect of the invention. In this context, the function generator is set up to deliver at least a first signal by means of a first signal unit and a second signal by means of a second signal unit. The method comprises the following method steps: generation of a test signal in the function generator; comparison of the test signal with a calibration signal; time displacement of the test signal, so that the phase-angle value of the test signal is varied relative to the calibration signal.

As soon as the phase-angle value of the test signal relative to the calibration signal is 0°, the function generator is preferably calibrated with regard to a time incoherence, and the actual first signal and/or second signal can be delivered at the output of the function generator.

The time displacement in this context preferably comprises the steps: loading of a current phase-angle value from a buffer; variation of the current phase-angle value; and buffering of the varied phase-angle value in the buffer. In this manner, a stepwise approximation to the desired phase-angle value zero degrees, is achieved. The comparison of the test signal with a calibration signal provides an output signal in a comparison unit which is used to displace the test signal relative to the calibration signal in a defined manner with regard to time. The current phase-angle value of the buffer is used to displace the first signal and/or the second signal in time in order to adjust the registered coherence.

BRIEF DESCRIPTION OF THE DRAWINGS

In the following, the invention is described and explained in greater detail on the basis of drawings and exemplary embodiments only. In this context, individual components may be displayed with an exaggerated scale or in an oversimplified manner. The same reference numbers in the individual Figures stand for identical components of the exemplary embodiments.

The drawings show.

DETAILED DESCRIPTION OF THE DRAWINGS

Figure 1:
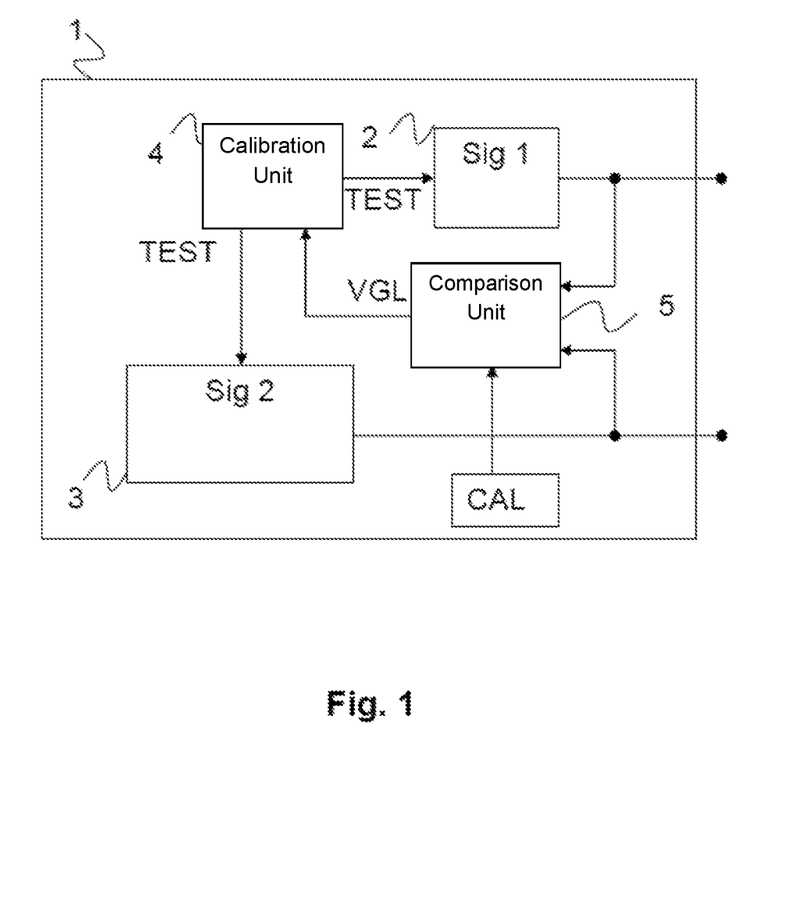
FIG. 1 a first exemplary embodiment of a function generator according to the invention.

FIG. 1 shows a first exemplary embodiment of a function generator 1 according to the invention. The function generator 1 provides a first signal unit 2 and a second signal unit 3. The first signal unit 2 delivers a first signal at a first output. The second signal unit 3 delivers a second signal at a second output of the function generator 1.

According to the invention, a calibration unit 4 and a comparison unit 5 are also provided in the function generator 1. The calibration unit 4 generates an internal test signal TEST. This test signal TEST is delivered to the first signal unit 2 and/or to the second signal unit 3. A comparison unit 5 is also connected downstream of the first signal unit 2. The comparison unit 5 compares the test signal TEST with a calibration signal CAL. An output signal VGL, which is supplied to the calibration unit 4, can be picked up at the output of the comparison unit 5. The output signal VGL of the comparison unit 5 accordingly shows to the calibration unit 4 a time coherence between the test signal TEST and the calibration signal CAL. The calibration unit 4 is now provided in order to displace the test signal TEST in time.

The calibration signal CAL is generated, here, within the function generator 1 and is, for example, a high precision quartz circuit or an oscillator circuit, for example, a voltage-controlled oscillator, abbreviation VCO.

Figure 2:
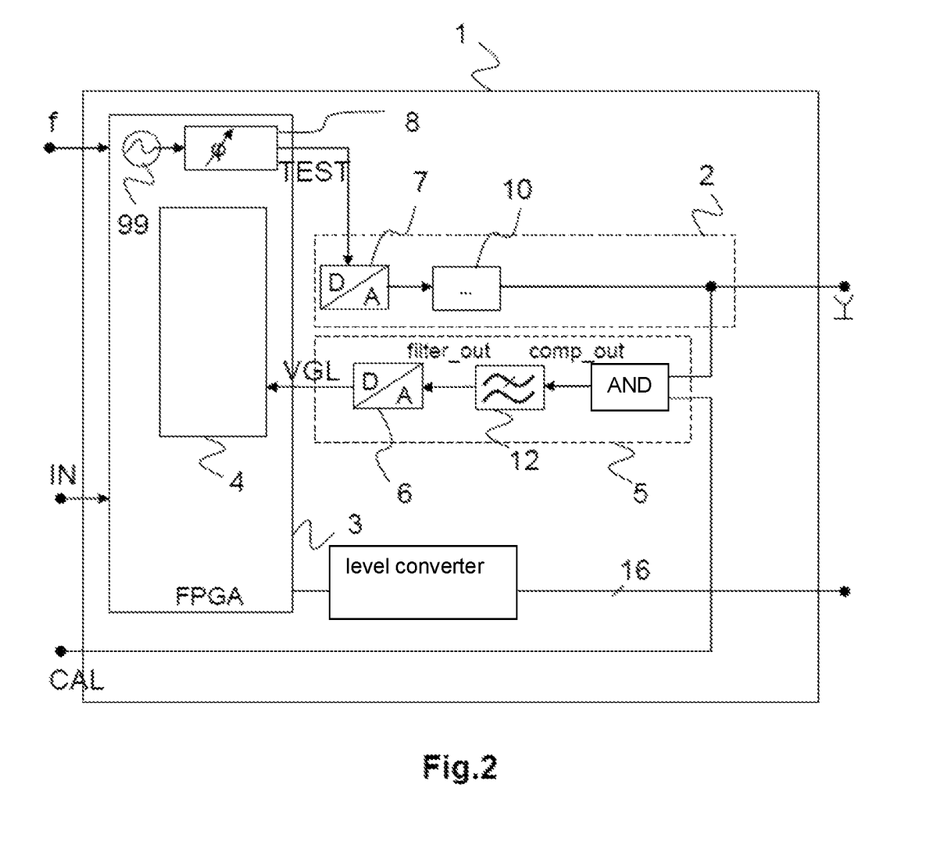
FIG. 2 a second exemplary embodiment of a function generator according to the invention.

FIG. 2 shows a second exemplary embodiment of a function generator 1 according to the invention. The function generator 1 also comprises the calibration unit 4, the comparison unit 5, the first signal unit 2 and the second signal unit 3 as shown in FIG. 1, wherein the comparison unit 5 and the first signal unit 2 are indicated with dashed lines. In particular, the first signal unit 2 is embodied as an analog unit. It comprises an analog-digital converter 7 and downstream analog circuit elements 10 which are not presented in greater detail here. An analog signal which is delivered via the first output of the function generator 1 to further circuit components, for example, to a device under test DUT, is delivered at the output of the analog unit 2.

Through the use of an analog unit 2 and, in particular, an analog-digital converter 7, the signal delay time of the first signal from its origin to the output of the function generator 1 is delayed. In particular, the signal is delivered by means of a signal source 99 of the FPGA which is at the same time also a part of the digital unit 3. Accordingly, the analog signal and also the digital signal are originally generated by means of the FPGA. As a result of the conversion by means of the analog-digital converter 7 and a possible settling processes of the further analog circuit elements 10, a time delay of the analog output signal cannot be avoided.

A time coherence between the first signal and the second signal is therefore initially not known. According to the invention, this incoherence between the first signal and the second signal is removed. For this purpose, the calibration unit 4 in FIG. 2 is fitted with a phase shifter 8. The phase shifter 8 receives a frequency signal f from the signal source 99 and makes this available to the analog-digital converter 7 and to the calibration unit 4 in the FPGA. The phase shifter 8 is preferably installed as a digital phase shifter 8 in the digital unit. The data of the test signals are varied in its phase until the test signal and the calculation signal comprise a phase difference of 0°. Using the signal f, all units in the function generator 1 are coupled with constant phases. The signal source 99 and the phase shifter 8 are used either in normal operating mode or in calibration mode. The signal source 99 is used to generate a waveform signal, such as sine, triangle or rectangle waveforms. The calibration unit 4 controls the calibration process. The phase shifter varies the phase as long as the comparison signal VGL is maximized, which is interpreted as a phase difference of 0° between the TEST signal and the calibration signal CAL. The comparison unit 5 will now be presented in greater detail. Accordingly, a comparator is provided, which is connected to the calibration signal CAL with a first input signal, and, with a second input, provides the analog output signal of the analog unit 2. During the calibration, the test signal TEST is connected to this input. The output comp_out of the comparator is connected to a low-pass filter 12. The low-pass filter 12 filters the alternating components out of the comparison result comp_out, so that a DC voltage $DC_{actual}$ of a given level is delivered at the output filter_out of the low-pass filter 12. This DC voltage $DC_{actual}$ is digitised in an analog-digital converter 6 and supplied to the calibration unit 4 as the signal VGL.

Furthermore, FIG. 2 shows that the second signal unit 3 and the calibration unit 4 are formed by means of an FPGA. The FPGA receives signal values via an input IN of the function generator 1 in order also to supply digital signals. In particular, ARB files with associated control information are transferred to the function generator 1 via this input IN. The digital signals are delivered by means of a level converter K at the output of the function generator 1. According to FIG. 2, the delivered digital signals comprise sixteen individual signals. As the first signal unit 2, the analog unit 2 also has the FPGA as signal source and accordingly processes a digital signal.

Figure 3:
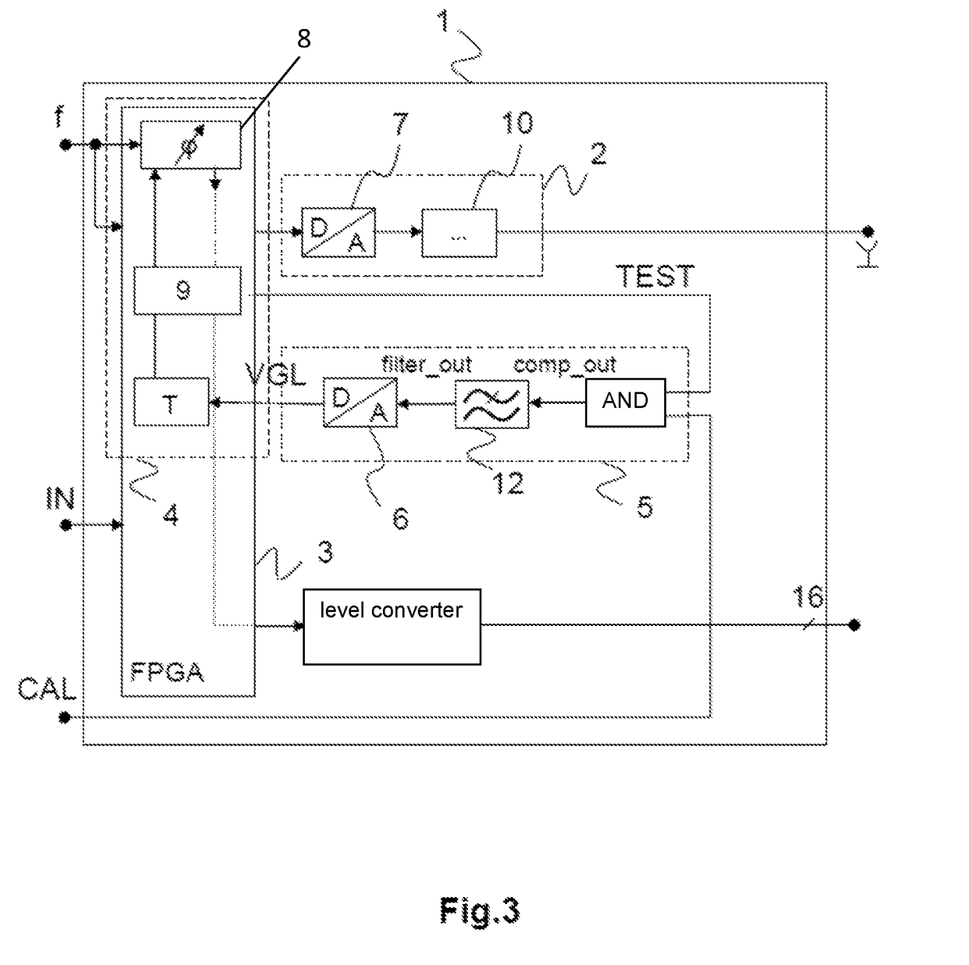
FIG. 3 a third exemplary embodiment of a function generator according to the invention.

FIG. 3 shows a third exemplary embodiment of the function generator 1 according to the invention. In the following, reference will be made only to the differences between FIG. 2 and FIG. 3. The phase shifter 8 is preferably installed as a digital phase shifter 8 in the digital unit. The data of the test signals are varied in its phase until the test signal and the calculation signal comprise a phase difference of 0°. Using the signal f, all units in the function generator 1 are coupled with constant phases. The phase shifter 8 is used either in normal operating mode or in calibration mode. The calibration unit 4 controls the calibration process. The phase shifter varies the phase as long as the comparison signal VGL is maximized, which is interpreted as a phase difference of 0° between the TEST signal and the calibration signal CAL.

The phase shifter 8 can displace the frequency signal f especially in a stepwise manner. In this context, as a parameter of the FPGA, the time T is specified as a step number referenced to an oscillation period of the frequency signal f, so that, with a total step number of, for example, 384 per one period of the frequency signal f and a frequency f of 500 MHz, the phase-angle value $\varphi_x$ is adjustable with a step width of 5.2 picoseconds in the example. These numerical values should be regarded only as computational examples; other step widths, other frequencies and other total step numbers per period are also conceivable according to the invention.

Accordingly, the output signal of the phase shifter 8 can be delayed in time in a defined manner, wherein the specification of the delay is implemented by the calibration unit 4 in the FPGA. The currently adjusted phase-angle value $\varphi_x$ is stored in a buffer 9 of the calibration unit 4 in the FPGA.

The phase shifter 8 transfers a frequency signal f displaced in time by means of the current phase-angle value $\varphi_x$ to the calibration unit 4. The frequency signal f is delivered to the digital unit 3 as a clock rate. The digital unit 3 uses the frequency signal f in order to drive a digital signal processing, for example, a signal conditioning, a filtering and/or level correction. The digital unit 3 generates a calibration signal, especially a square-wave signal, for example, with a frequency of 31.25 MHz for the calibration unit 4. This calibration signal is output as a test signal TEST via the analog unit 2.

The buffer 9 is provided to store the current phase value $\varphi_x$. This current phase of value q can be loaded from the buffer 9 and varied if it is necessary to displace the test signal TEST further.

The calibration unit 4 provides a time-adjustment unit T. The time-adjustment unit T evaluates the output signal VGL of the comparison unit 5 on the basis of the DC voltage component $DC_{actual}$ and, in this context, registers the extent to which the DC voltage component $DC_{actual}$ is a maximal DC voltage component $DC_{max}$. If the DC voltage component $DC_{actual}$ of the output signal VGL of the comparison unit 5 is not the maximal DC voltage component $DC_{max}$, the calibration unit 4 will load and vary the current phase-angle value q from the buffer 9. Following this, the varied phase-angle value is delivered to the phase shifter 8. The phase shifter 8 displaces the frequency signal f by the varied phase-angle value. This varied phase-angle value is delivered to the calibration unit 4 in the FPGA, wherein the FPGA now once again supplies the delayed test signal TEST to the analog unit 2. Alternatively, the digital unit 3 generates the test signal TEST in order to calibrate the runtime delay which arises in the case of the signal generation in a similar manner by means of the calibration unit. Following this, a comparison by means of a comparison unit 5 is once again implemented in order to check whether the now varied phase-angle value achieves a maximal DC voltage component $DC_{max}$.

Instead of the calibration of an analog signal presented in FIG. 2, a calibration of a digital signal, which is generated by means of a digital unit 3 and delivered by the function generator 1 at the second output, is implemented according to FIG. 3. The comparison unit 5 and the calibration unit 4 are constructed in an identical manner to the exemplary embodiment according to FIG. 2. In the exemplary embodiment according to FIG. 3, the second signal unit 3 is now calibrated, thereby displacing a digital test signal TEST relative to the calibration signal CAL.

Figure 4:
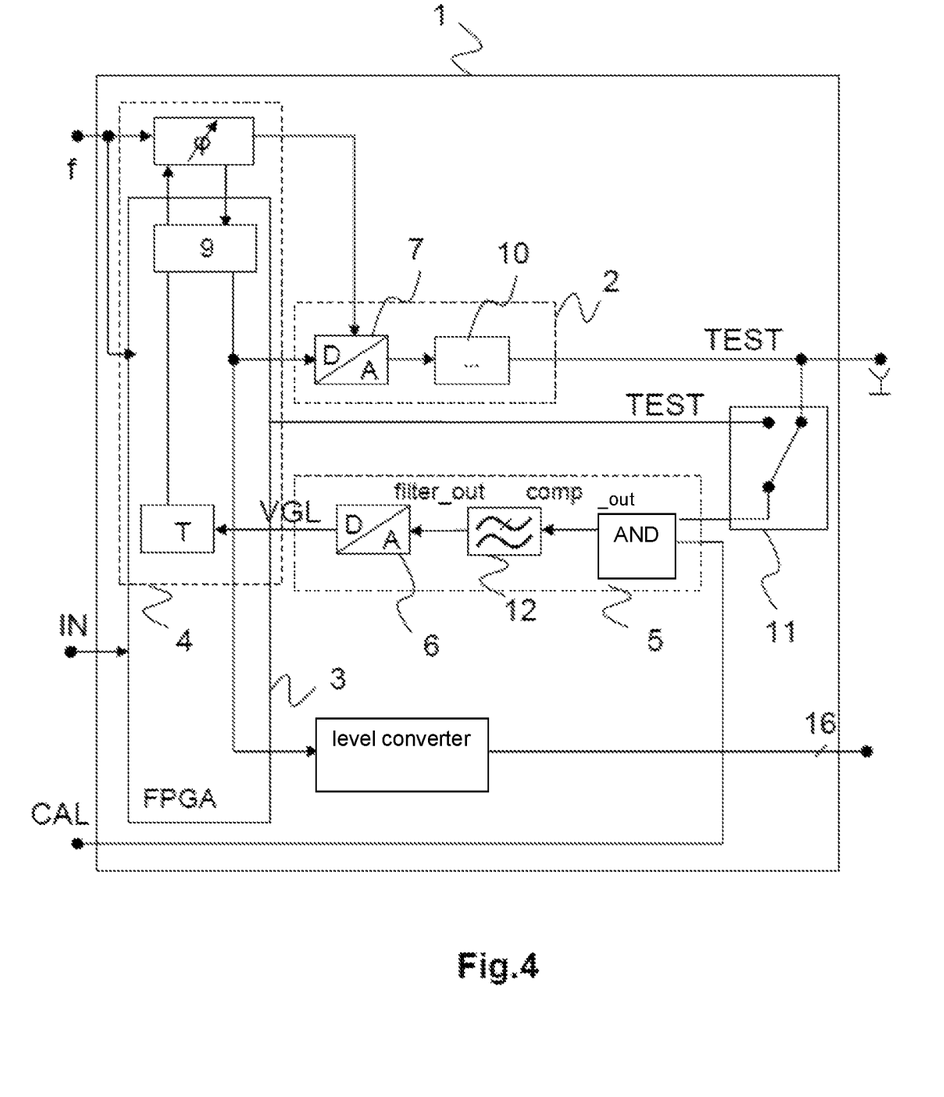
FIG. 4 a fourth exemplary embodiment of a function generator according to the invention.

FIG. 4 shows a fourth exemplary embodiment of the function generator 1 according to the invention. FIG. 4 presents the calibration of the first signal unit 2 and also of the second signal unit 3. A switchover unit 11 is provided to switch over the calibration of the signal units 2, 3. According to FIG. 4, the analog signal and also the digital signal are time displaced relative to an external calibration signal CAL. The signal unit 3 preferably provides its own phase shifter so that time coherent output signals can be picked up at the output of the function generator 1, to ensure that the signal units 2, 3 can generate time-coherent signals relative to one another. A resampler, can be provided in the signal unit 3, in order to obtain a phase shifter. This resampler can function as a phase shifter with almost any arbitrarily fine resolution. For analog signals to be output with a comparatively low frequency, for example, a few kHz, only a low sampling rate is required, for example, in the order of magnitude of a few mega-samples per second instead of the full available sampling rate of, for example, 500 mega-samples per second. In this context, the analog-digital converter 7 is further operated with the full available sampling rate of 500 mega-samples per second. The resampler accordingly interpolates the sampled values of the relatively slower sampling rate of, for example, 2 mega-samples per second up to the full sampling rate of, for example, 500 mega-samples per second. The calibration is successful if a defined phase-angle value $\varphi$ is adjusted between the analog signal and the digital signal of the function generator 1. The phase-angle value $\varphi$ between the analog signal and the digital signal is, for example, zero degrees. In order to store the phase differences $\Delta\varphi$ between the first signal and the calibration signal CAL or respectively the second signal and the calibration signal CAL, the buffer 9 is provided in the FPGA.

The function generators 1 illustrated in FIG. 1 to FIG. 4 provide an FPGA which receives so-called ARB files at the input IN and converts these correspondingly into signals, wherein a signal-dependent time delay through buffering of registered time-characteristic delays leads to a defined and known coherence of all output signals in the function generator 1.

It is provided that the time coherence is adjustable, so that, for example, the analog signal is delivered with a certain time delay T relative to the digital signal. This time delay can be implemented dependent upon the phase-angle value or dependent upon a defined time specification, for example, 30 ms.

Figure 5:
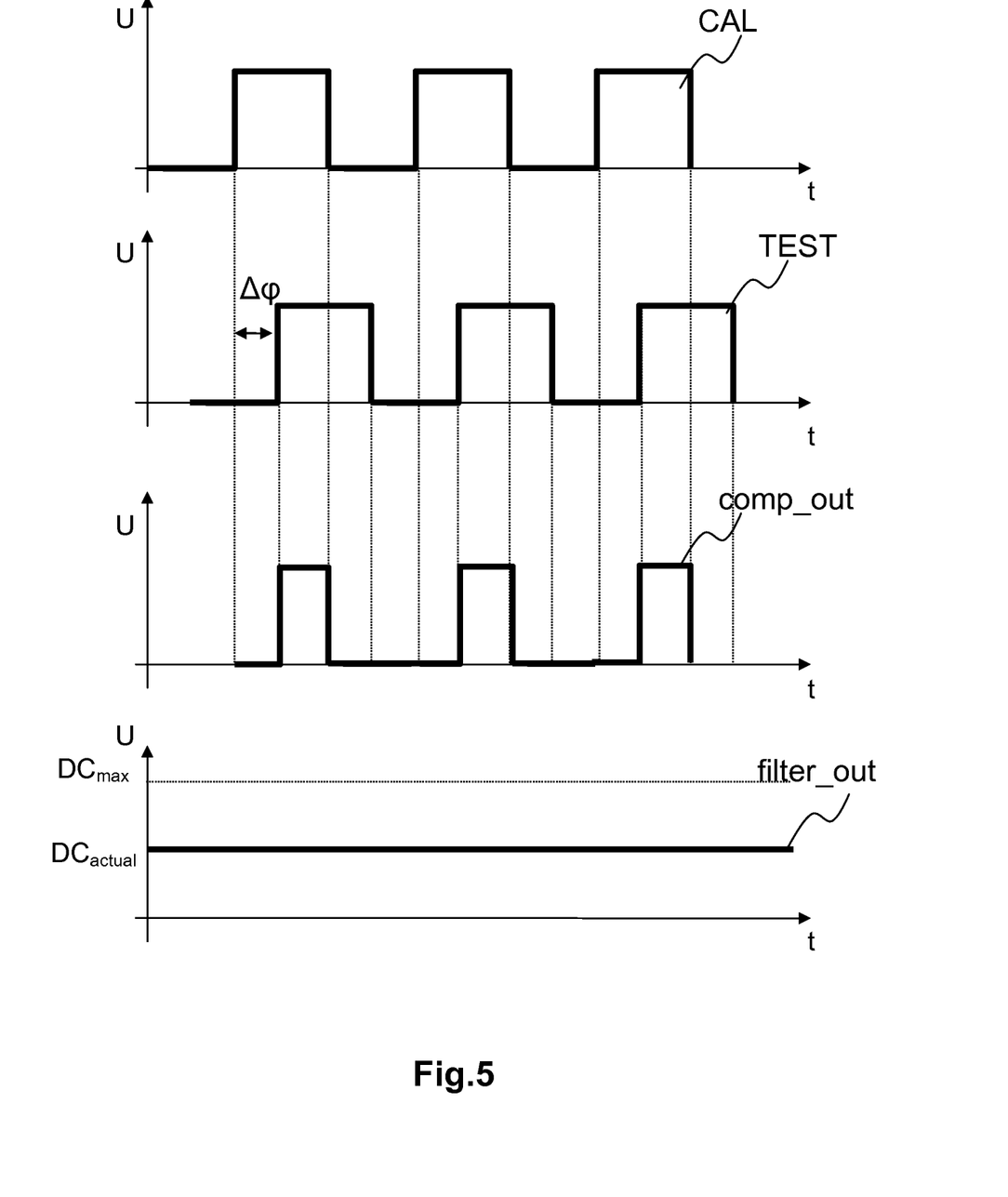
FIG. 5 signal characteristics of a test signal according to the invention by comparison with a calibration signal with a defined phase-angle value not equal to zero degrees.

FIG. 5 shows signal characteristics according to the invention of the test signal TEST of the calibration signal CAL, of the output signal comp_out of the comparator and the output signal filter_out of the low-pass filter unit 12. In this context, a time coherence $\Delta\varphi$ between the test signal TEST and the calibration signal CAL is shown in FIG. 5. This time coherence $\Delta\varphi$ leads to an output signal VGL in a comparison unit 5 which provides a DC component $DC_{actual}$ reduced relative to the test signal TEST and the calibration signal CAL. The output signal VGL of the comparison unit 5 is therefore not provided with a maximal DC component $DC_{max}$. This is attributable to the time delay $\Delta\varphi$ adjusted in a defined manner. By means of the low-pass filter 12, frequency components are removed from the output signal comp_out of the comparator, so that a DC voltage signal is obtained at the output filter_out of the low-pass filter 12. In this context, the DC voltage component $DC_{actual}$ is not equal to the maximal DC voltage component $DC_{max}$. Now, if a phase-angle value $\varphi$ of zero degrees is to be achieved, the calibration unit 4 will vary the current phase-angle value $\varphi_x$ stored in the buffer 9, in order to reduce the time delay $\Delta\varphi$.

The varying of the phase-angle value $\varphi_x$ is implemented especially stepwise, for example, by incrementing the phase angle $\varphi$ in each case by a step width of the phase shifter 8. The step width can be adjusted in a variable manner and can also provide values substantially larger than 1. Accordingly, larger phase differences $\Delta\varphi$ can be achieved, so that the calibration process is accelerated. Expected values can also be pre-set. The expected values may have been determined by a pre-analysis of the signal units 2, 3 and stored permanently in the buffer 9 as an output value.

Figure 6:
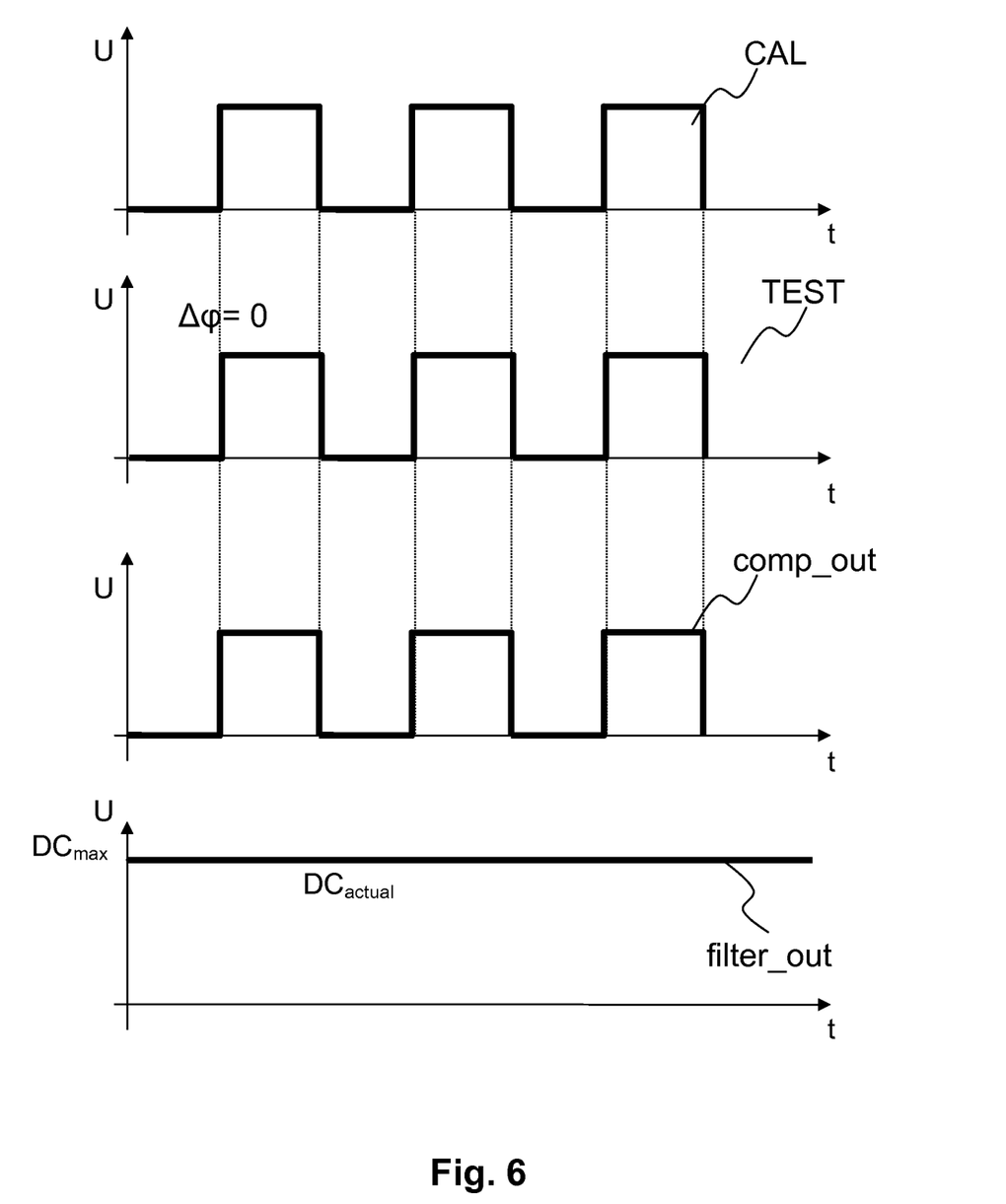
FIG. 6 signal characteristics of a test signal according to the invention by comparison with a calibration signal with a defined phase-angle value of zero degrees.

By contrast with FIG. 5, FIG. 6 shows the signal characteristic of the test signal TEST and of the calibration signal CAL in the case of a phase difference $\Delta\varphi$ of zero degrees. It is evident that the output signal comp_out of the comparator provides a maximal DC voltage component. This is particularly evident through the output signal filter_out of the filter unit 12. Here, the actual value of the DC voltage component $DC_{actual}$ is equal to the maximal DC component $DC_{max}$. In this manner, a coherence between the test signal TEST and the calibration signal CAL is achieved, wherein the phase difference $\Delta\varphi$ is zero degrees. If the first signal and/or the second signal are generated now, these signals are delivered at the first output or respectively the second output of the function generator 1 retaining the current phase-angle value $\varphi_x$.

In particular, the calibration unit 4 registers the DC voltage components $DC_{actual}$ of the 0° phase-angle value. Other phase values are internally set in the digital phase shifter 8 by means of the FPGA. For this purpose, the test signal TEST is time displaced in the smallest possible step width and registered for every adjusted phase-angle value of the DC voltage component of the output signal VGL of the comparison unit 5. In this context, the test signal TEST is displaced in total by at least one half period. In order to accelerate the calibration, the phase difference $\Delta\varphi$ is first calibrated to zero degrees. If the phase displacement of the resampler is known, it can be pre-set correspondingly. If a value different from zero degrees is required for the phase difference $\Delta\varphi$, the phase difference $\Delta\varphi$ is initially calibrated to $\Delta\varphi_{start}$ equal to zero degrees. For this purpose, a given phase displacement of the resampler $\varphi_{Resampler}$ is obtained. If a value different from zero degrees is required for the phase difference $\Delta\varphi$, the phase of value of the resampler $\varphi_{Resampler}$ is increased by this required value $\Delta\varphi$, wherein the signal can be used without re-calibration.

Figure 7:
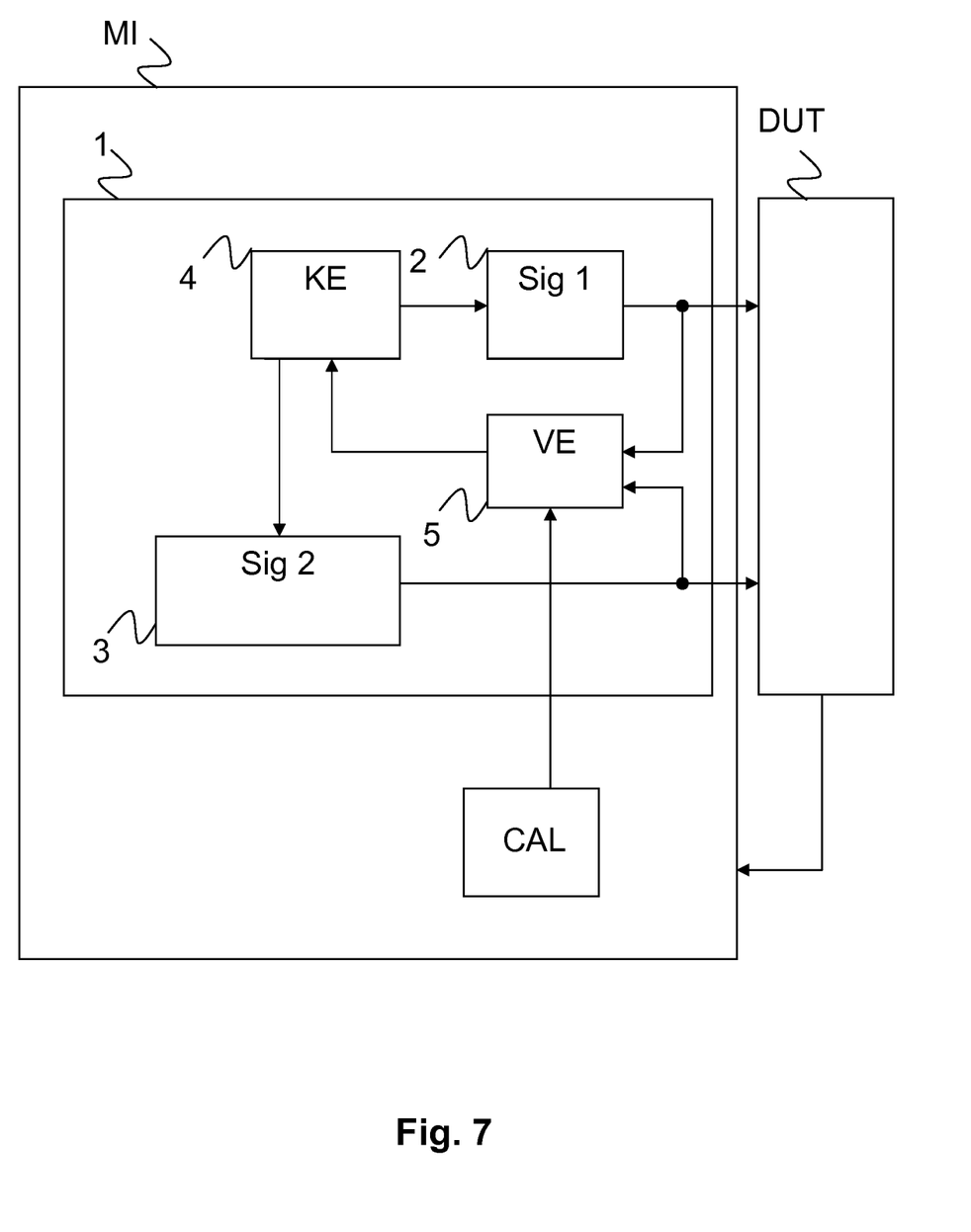
FIG. 7 a first exemplary embodiment of a system according to the invention.

FIG. 7 shows a system according to the invention. In this context, the function generator 1 according to FIG. 1 is introduced into a measuring instrument MI. The measuring instrument MI is connected to a device under test DUT with its outputs of the function generator 1. The device under test DUT generates measurement signals which are supplied in turn to the measuring instrument MI. Furthermore, a signal source is provided which generates the calibration signal CAL. The calibration signal CAL is shown here as an external calibration signal CAL of the function generator 1. For example, the signal source is a voltage-controlled oscillator VCO. Accordingly, the calibration source can also be used for further function units of the measuring instrument MI not illustrated here.

Figure 8:
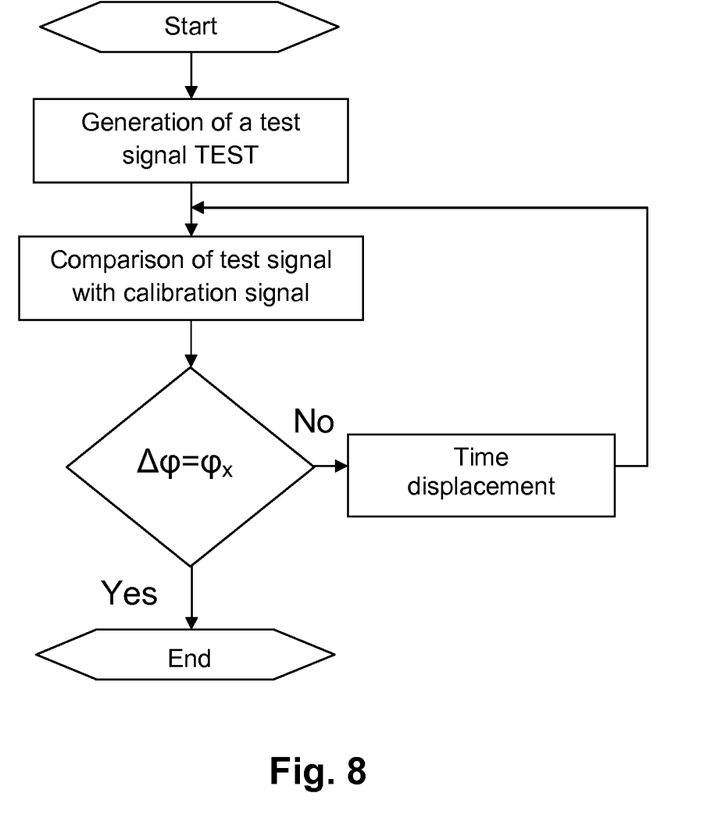
FIG. 8 a first flow diagram of a method according to the invention.

FIG. 8 shows a flow diagram of a method according to the invention. The method comprises the steps: generation of a test signal TEST; comparison of the test signal TEST with a calibration signal CAL and time displacement of the test signal TEST if a check shows that a phase difference $\Delta\varphi$ does not correspond to a predefined phase value $\varphi_x$, for example, zero degrees. The test signal TEST is time displaced until the phase difference $\Delta\varphi$ corresponds to the predefined phase value $\varphi_x$.

Figure 9:
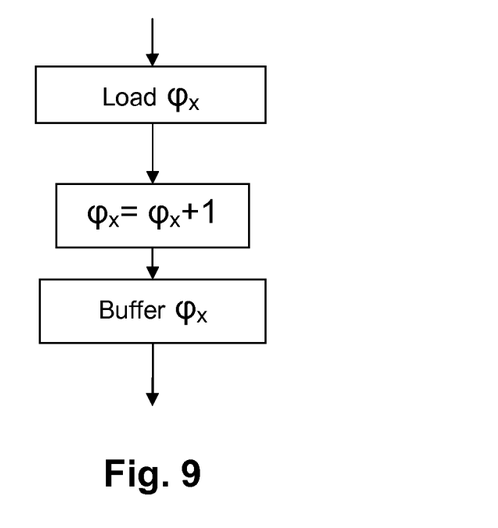
FIG. 9 a second flow diagram of the method according to the invention.

In FIG. 9, the step of the time displacement according to FIG. 8 is shown in greater detail. Initially, a current phase-angle value $\varphi_x$ is loaded from a buffer 9. Following this, the current phase-angle value $\varphi_x$ is varied. This is achieved, for example, by incrementing or decrementing the current phase-angle value $\varphi_x$. Alternatively, an expected value can also be adjusted or time displaced in steps relatively larger than 1. Following this, the varied phase-angle value $\varphi_x$ is stored in the buffer 9.

All of the features shown, claimed and described can be combined arbitrarily with one another. In this context, especially the calibration of the analog signals and of the digital signals, is exchangeable and can be varied.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A function generator for the delivery of electrical signals, comprising:
   a first digital to analog converter and downstream analog circuit elements configured to deliver a first signal at a first output and a programmable integrated circuit configured to deliver a second signal at a second output, wherein the programmable integrated circuit is digital, and the second signal is a digital signal, and wherein an input is configured to receive signal values to supply the digital signals,
   a calibration circuit comprising a phase shifter configured to evaluate a phase angle value and a buffer configured to generate a test signal, wherein the test signal can be supplied to the first digital to analog converter and/or to the programmable integrated circuit, and the buffer is further configured to store the phase angle value, wherein the calibration circuit is configured to provide an adjustable time coherence of the first signal at the first output to the second signal at the second output, a comparator comprising a comparator circuit or an AND gate, a low pass filter and a second digital-analog converter connected downstream of the first digital to analog converter and/or the programmable integrated circuit, wherein the comparator is configured to compare the test signal delivered at the first output and/or at the second output with a calibration signal, and wherein an output signal of the comparator is configured to supply the calibration circuit.

2. The function generator according to claim 1, wherein the first signal is an analog signal.

3. The function generator according to claim 1, wherein the first digital to analog converter or the programmable integrated circuit comprises the calibration circuit.

4. The function generator according to claim 1, wherein the calibration circuit comprises a phase shifter, so that the phase angle of the first signal and/or of the second signal is adjustable.

5. The function generator according to claim 1, wherein the calibration circuit is configured to register a maximal DC component of the output signal of the comparator and, upon registration of the maximal DC component of the output signal, a phase angle of the test signal agrees with a phase angle of the calibration signal.

6. The function generator according to claim 1, wherein the calibration signal can be supplied to the function generator as an external signal.

7. A system comprising a measuring instrument and a device under test, wherein the measuring instrument provides the function generator according to claim 1, and wherein the first signal and the second signal of the function generator are supplied to the device under test at the same time.

8. The system according to claim 7, wherein the first signal and the second signal of the function generator are supplied to the device under test only when a phase-angle value between the first signal and the second signal corresponds to a defined phase-angle value.

9. The system according to claim 7, wherein the first signal is an analog signal.

10. A method for the delivery of electrical signals through a function generator, wherein the function generator is set up to deliver at least one first signal by a digital to analog converter and downstream analog circuit elements and a second signal by a programmable integrated circuit, wherein the second signal is a digital signal, comprising:

receiving signal values to supply the digital signals by an input;

generating of a test signal by a calibration circuit comprising a phase shifter configured to evaluate a phase angle value, and a buffer in the function generator, wherein the calibration circuit is configured to provide an adjustable time coherence of the first signal at the first output to the second signal at the second output;

comparing of the test signal supplied to the digital to analog converter or to the programmable integrated circuit by a comparator connected downstream of the digital to analog converter or the programmable integrated circuit with a calibration signal;

time displacing of the test signal, so that the phase-angle value of the test signal is varied relative to the calibration signal; and storing the phase angle value in the buffer.

11. The method according to claim 10, wherein the time-displacement is determined by:

loading of a current phase-angle value from a buffer;
variation of the current phase-angle value; and
buffering of the varied phase-angle value in the buffer.

* * * * *